United States Patent
Kawai

(10) Patent No.: US 6,355,949 B1
(45) Date of Patent: Mar. 12, 2002

(54) SOLID STATE IMAGING APPARATUS WITH HORIZONTAL CHARGE TRANSFER REGISTER WHICH CAN TRANSFER SIGNAL CHARGE FASTER

(75) Inventor: Shinichi Kawai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/455,403

(22) Filed: Dec. 6, 1999

(30) Foreign Application Priority Data

Dec. 10, 1998 (JP) .......................................... 10-351406

(51) Int. Cl.7 ........................................... H01L 29/768
(52) U.S. Cl. ...................... 257/215; 257/216; 257/232; 257/233; 257/355
(58) Field of Search ................................ 257/215–216, 257/355–362, 232–233

(56) References Cited

U.S. PATENT DOCUMENTS

| 4,375,597 A | * | 3/1983 | Kosonocky | 327/515 |
| 4,468,684 A | * | 8/1984 | Esser et al. | 257/222 |
| 5,210,433 A | * | 5/1993 | Ohsawa et al. | 257/250 |
| 5,258,846 A | * | 11/1993 | Hirose | 348/295 |
| 5,612,554 A | * | 3/1997 | Funakoshi | 257/215 |

FOREIGN PATENT DOCUMENTS

| JP | 4-256364 | 9/1992 |
| JP | 4-262679 | 9/1992 |
| JP | 4-277986 | 10/1992 |
| JP | 5-30437 | 2/1993 |
| JP | 10-107252 | 4/1998 |
| JP | 10-136244 | 5/1998 |

* cited by examiner

Primary Examiner—Minh Loan Tran
Assistant Examiner—Thomas L Dickey
(74) Attorney, Agent, or Firm—Young & Thompson

(57) ABSTRACT

A charge transfer structure includes an insulating film on a first semiconductor region, a plurality of transfer electrodes and a signal generating circuit. The plurality of transfer electrodes are formed on the insulating film, and each of the plurality of transfer electrodes is composed of a barrier electrode and an accumulation electrode. The signal generating circuit generates first to 2N-th (N is a positive integer more than 1) pulse signals which are supplied to every 2N transfer electrodes of the plurality of transfer electrodes in an interline mode. As a result, a signal charge can be transferred for the 2N transfer electrodes at maximum during one cycle of the first to 2N-th pulse signals.

17 Claims, 11 Drawing Sheets

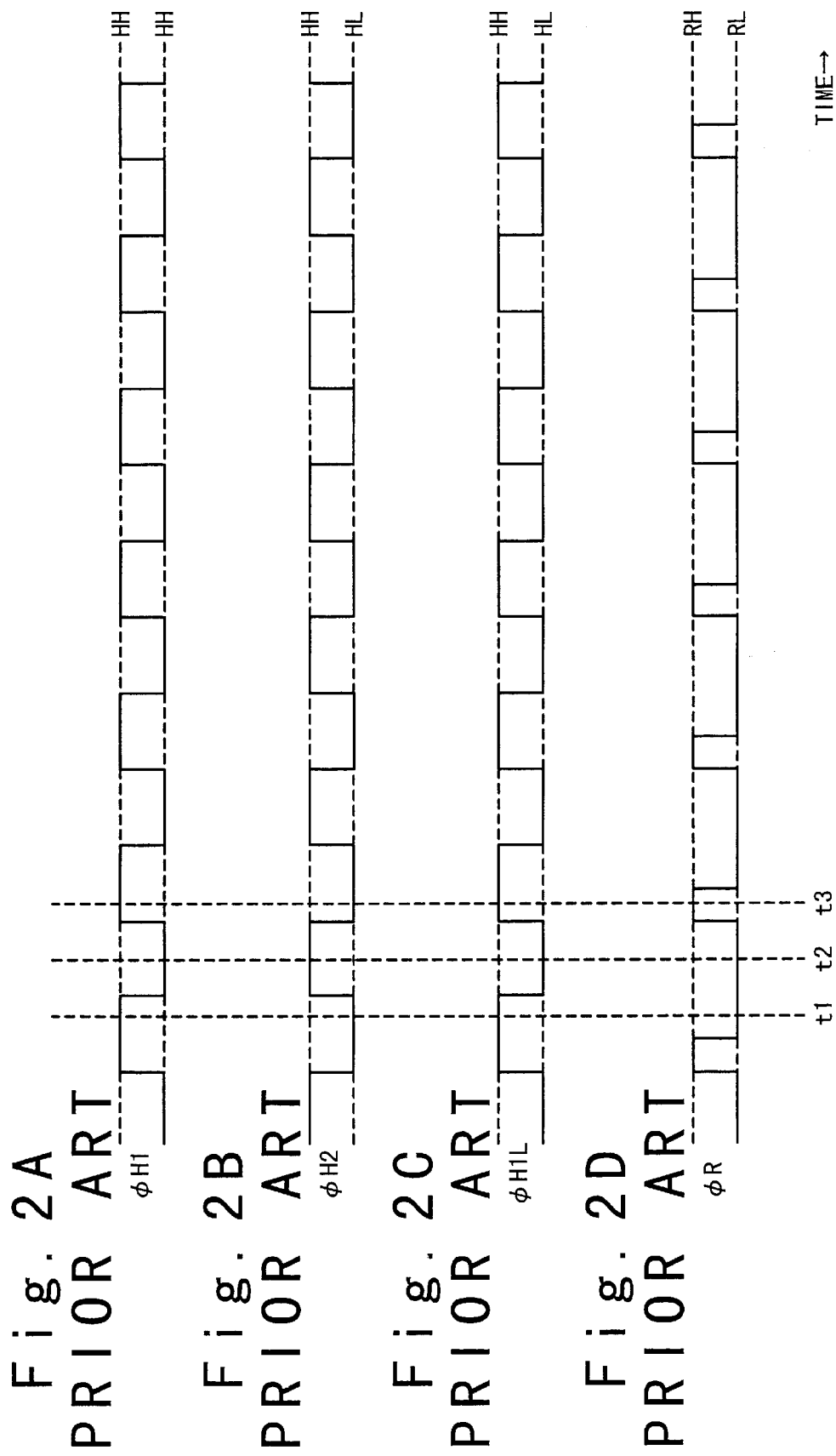

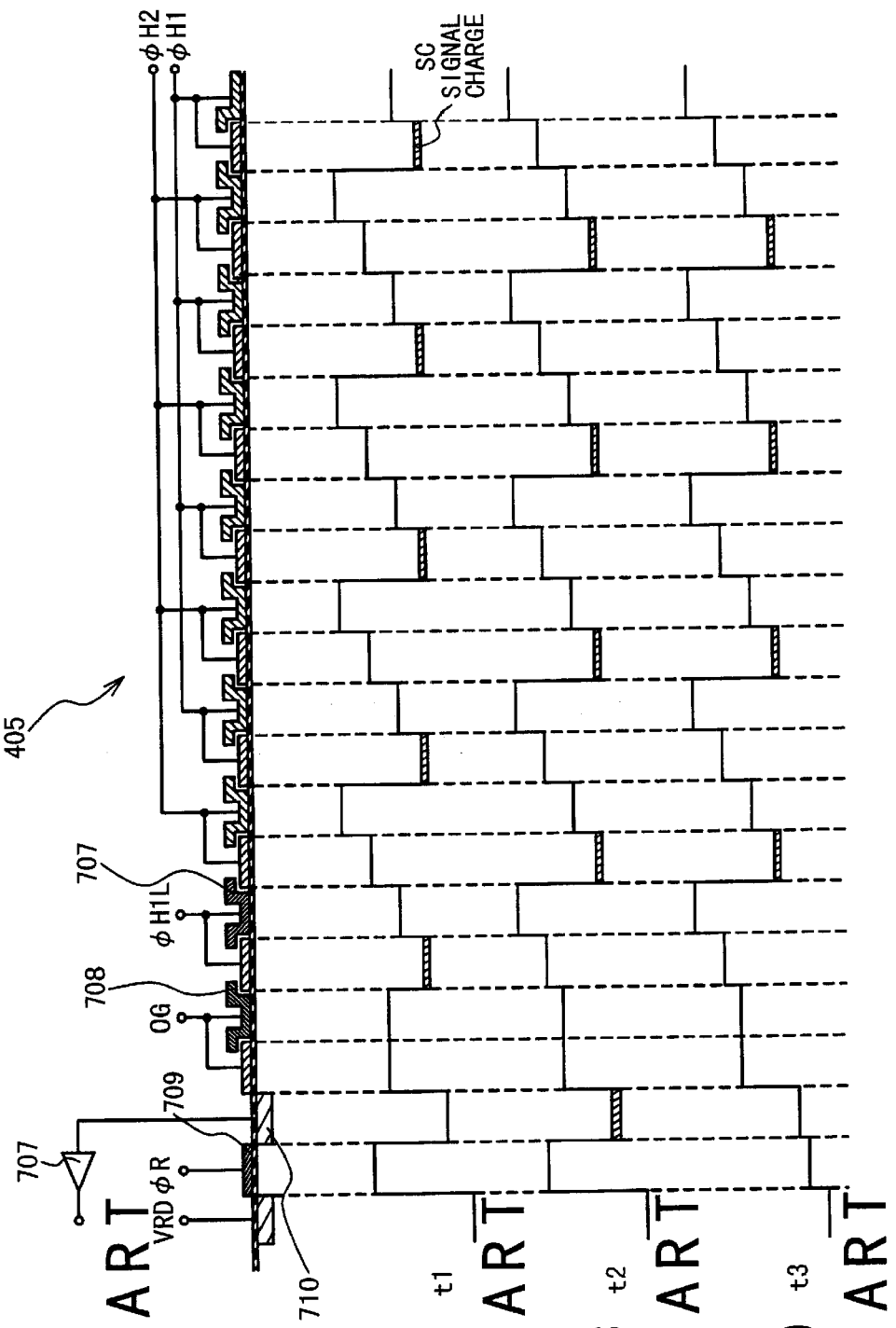

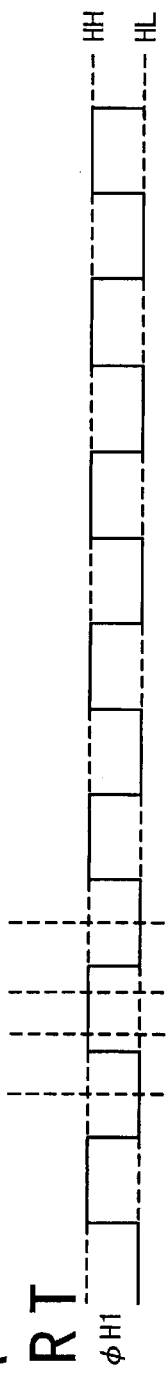
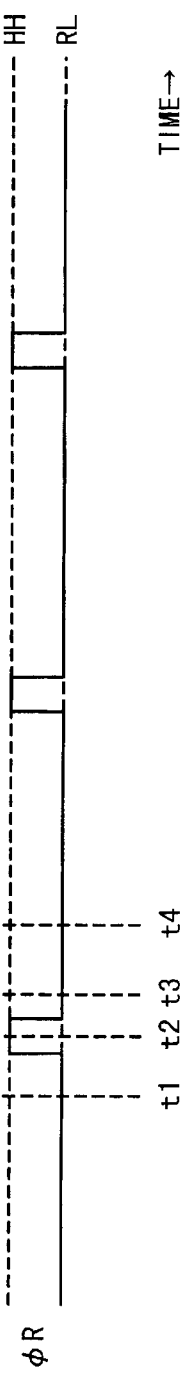
Fig. 4A PRIOR ART
Fig. 4B PRIOR ART
Fig. 4C PRIOR ART
Fig. 4D PRIOR ART

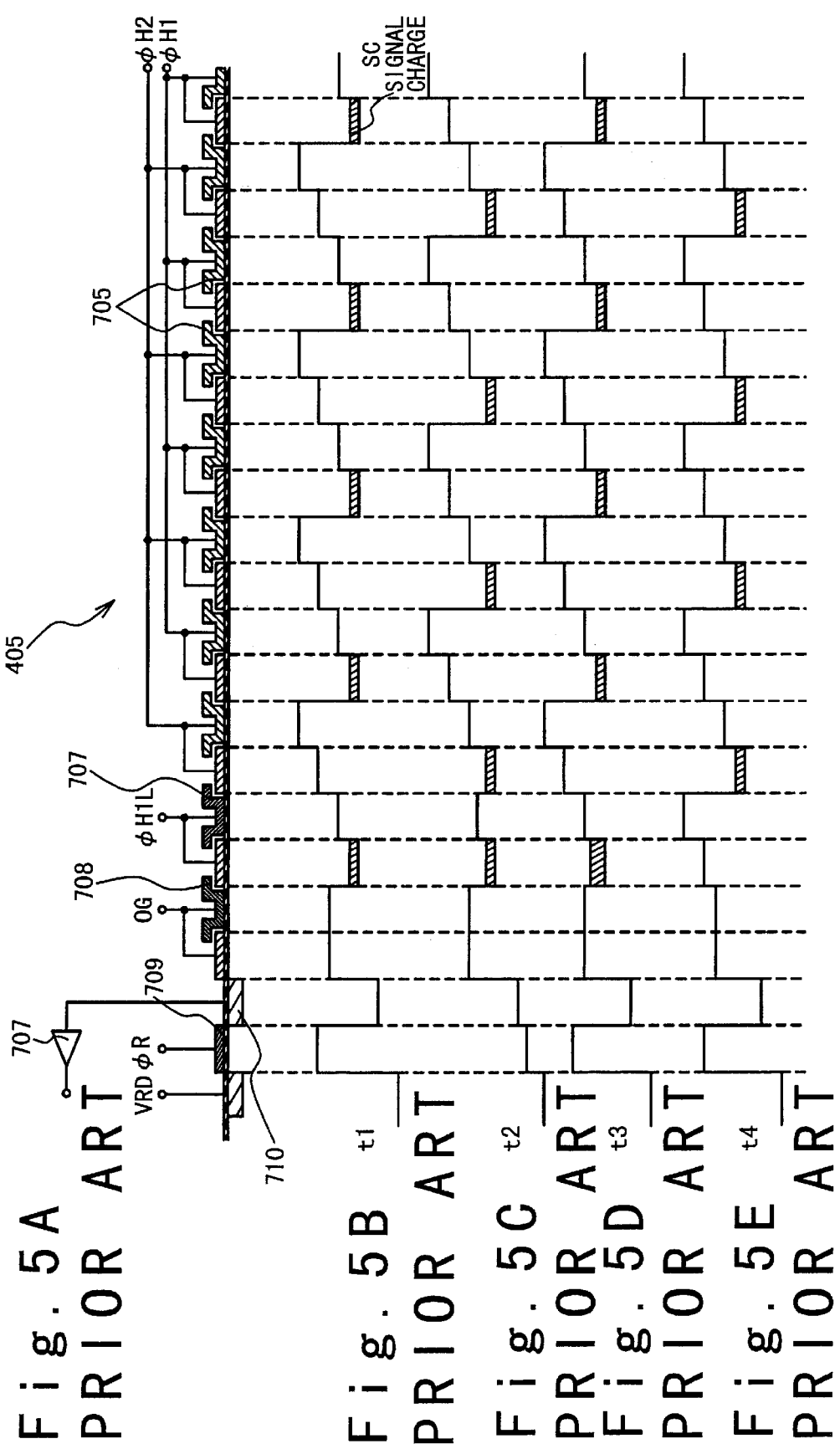

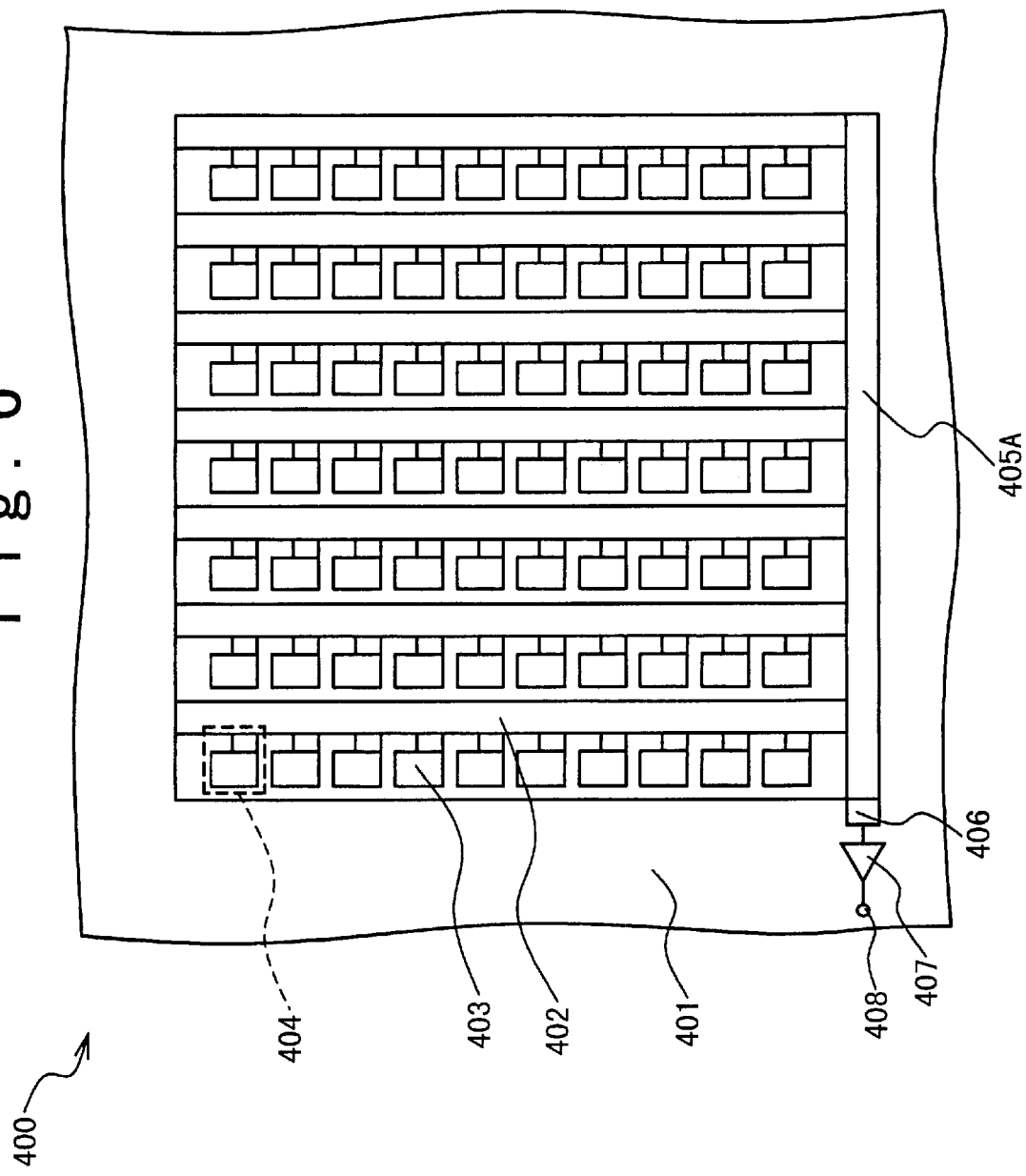

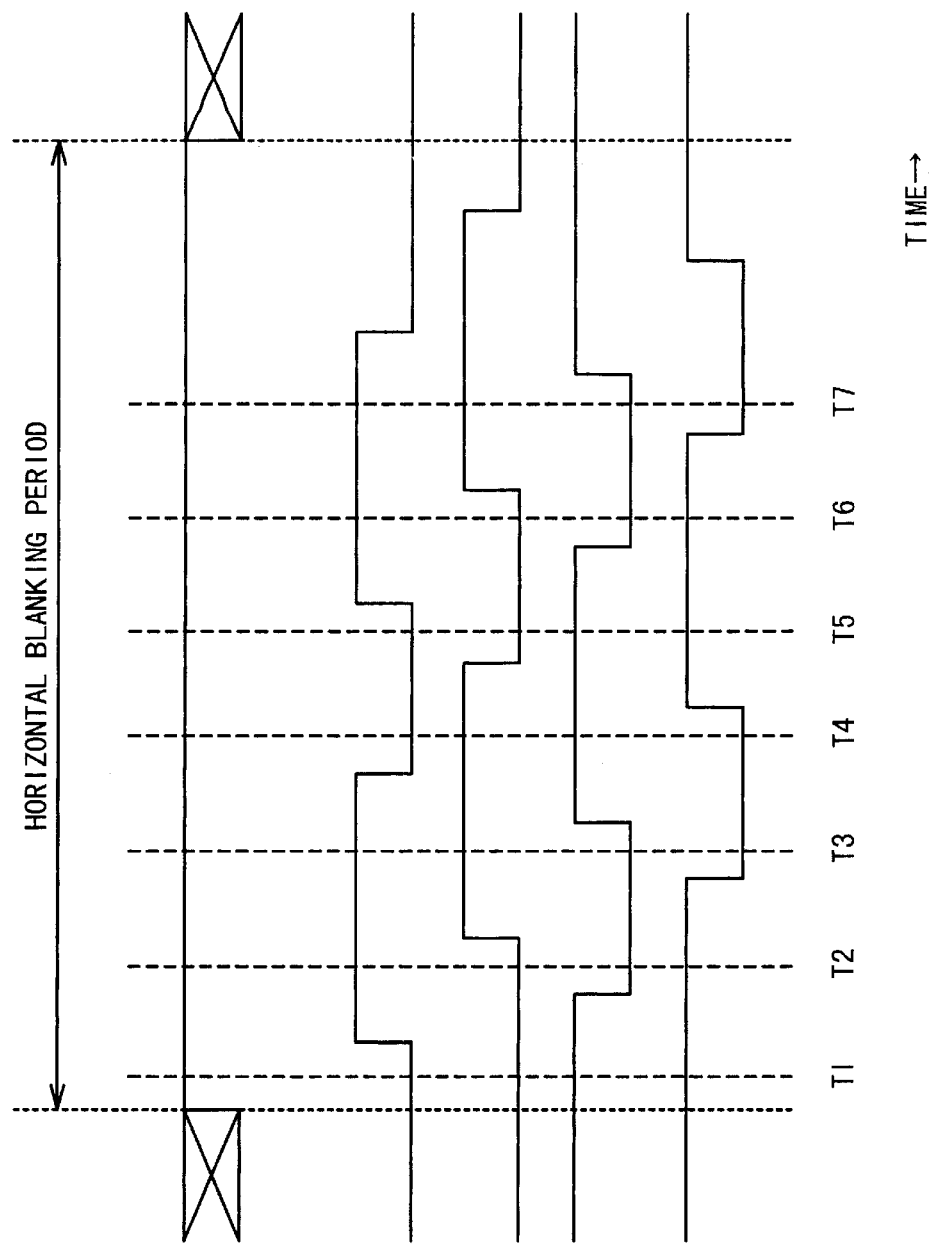

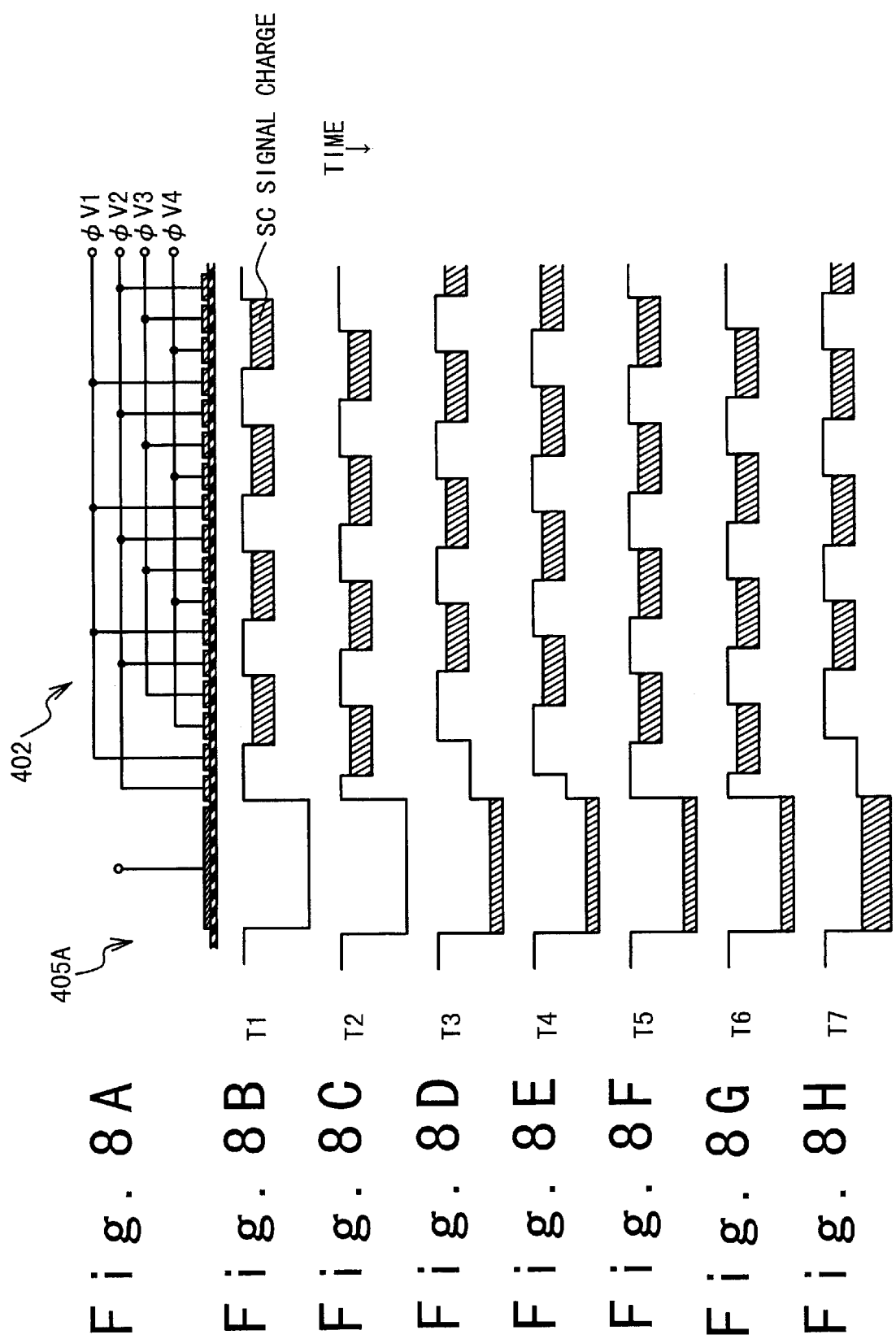

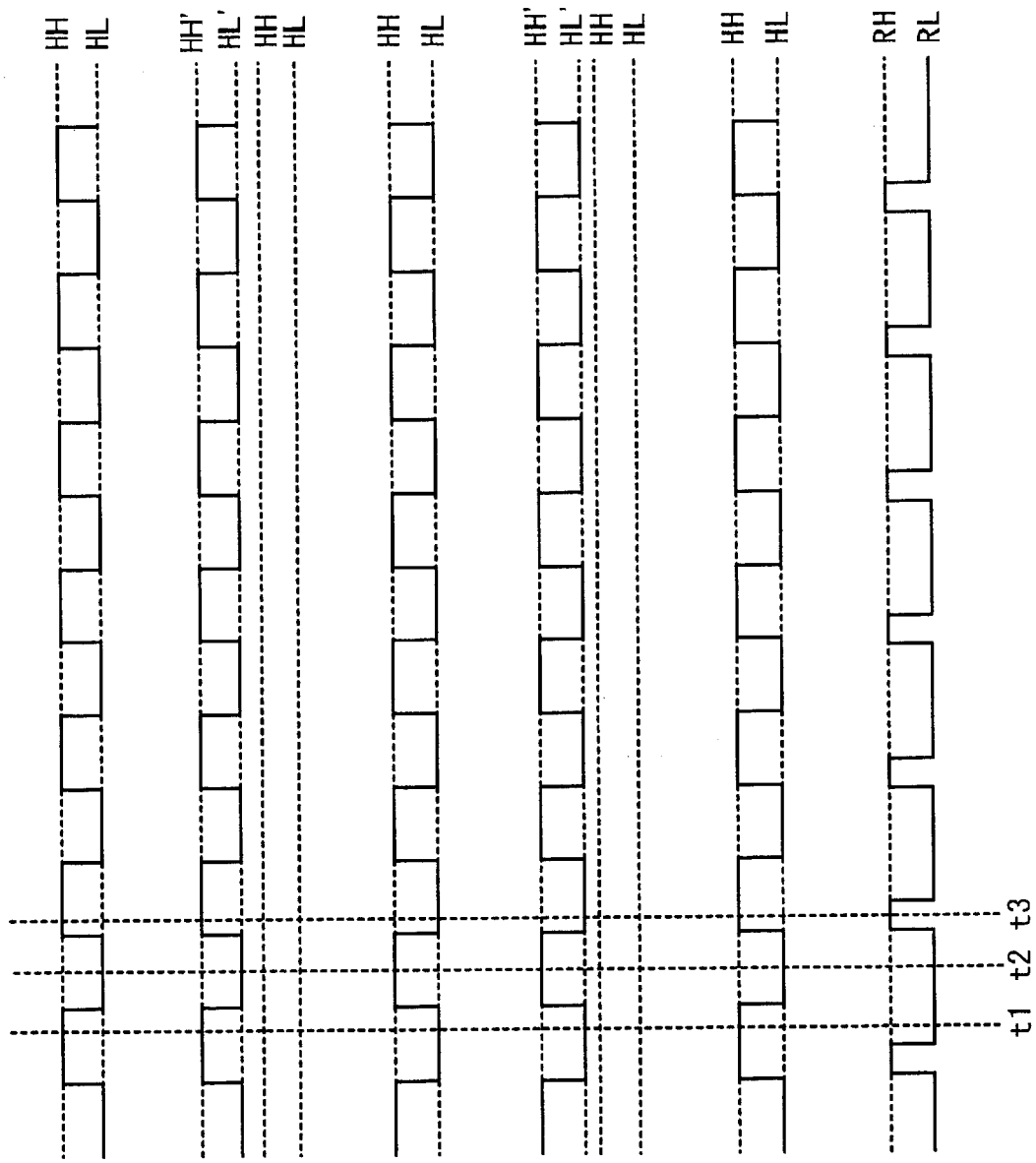

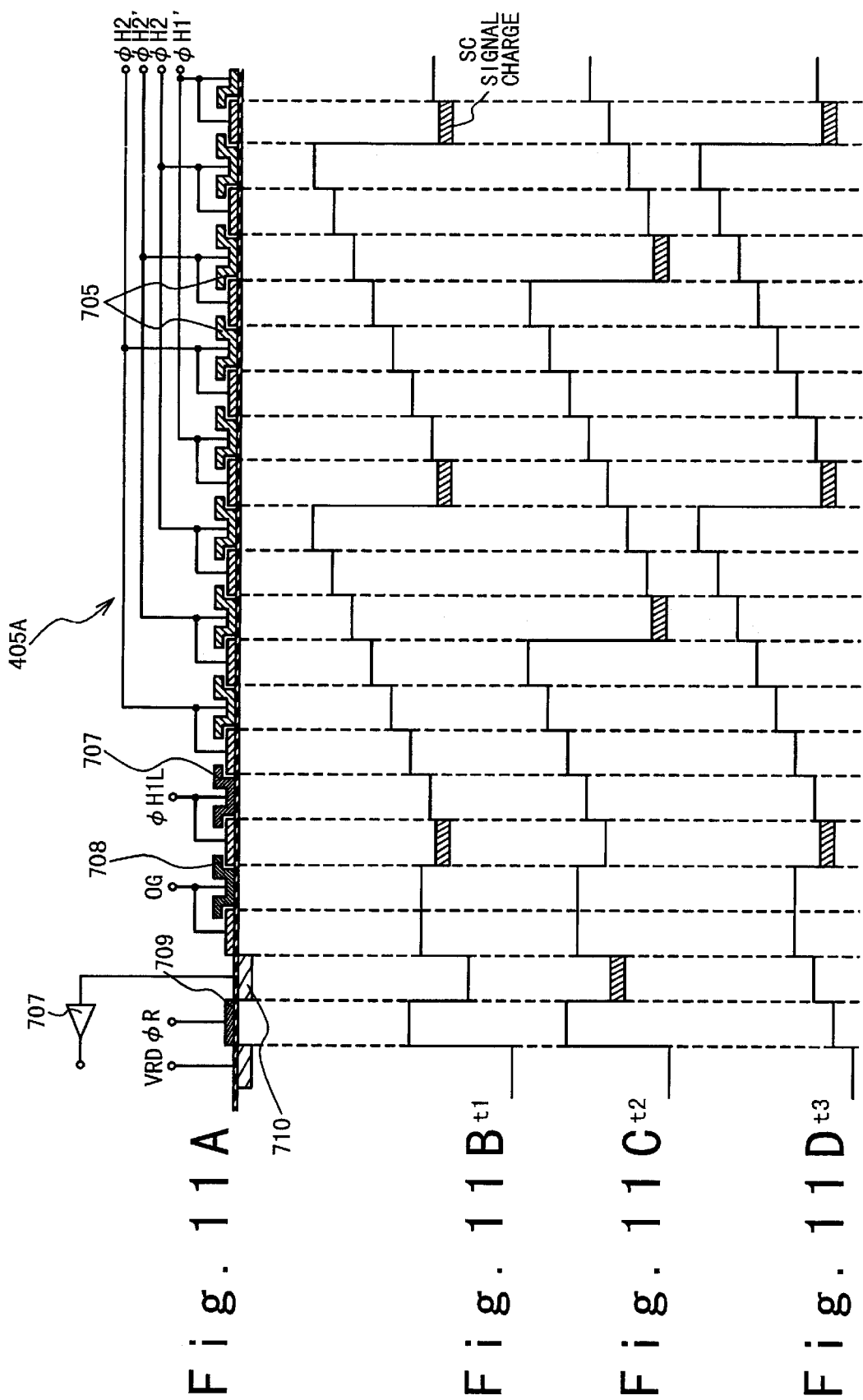

SOLID STATE IMAGING APPARATUS WITH HORIZONTAL CHARGE TRANSFER REGISTER WHICH CAN TRANSFER SIGNAL CHARGE FASTER

BACKGROUND OF THE INVENTION

1. Field of the Invention

The present invention relates to a solid state imaging apparatus with a horizontal charge transfer gate which can transfer signal charge faster.

2. Description of the Related Art

In a conventional solid state imaging apparatus, there are an individual mode in which a signal charge of each of pixels is individually outputted and an interline mode in which signal charges for a plurality of pixels adjacent to each other are collectively outputted. When the signal charges of the plurality of pixels are added and outputted, a resolution is degraded. However, it is possible to shorten a time required to output all the signal charges to thereby increase a frame rate. Both of the above-mentioned operations are necessary, when there are a case where it is desired to obtain a fine reproduction image and a case where it is desired to obtain a reproduction image having a high frame rate in the same image system. Especially in a solid state imaging apparatus having a large number of pixels in which it takes a long time to output the signal charges of all the pixels. As a result, the frame rate is decreased so that the motion of an object in a reproduction image becomes unnatural, when the motion of the object is large. Thus, when the object moves, the frame rate is desired to be higher in order to obtain a reproduction image in which the motion is natural.

As an example, a case will be described below where signal charges for four pixels of two pixels in a horizontal direction and two pixels in a vertical direction are added and outputted in a solid state imaging apparatus.

In order to add signal charges of two pixels adjacent to each other in the vertical direction, the signal charge in a vertical charge transfer register are transferred two times within a horizontal blanking period. A horizontal charge transfer register receives the signal charges corresponding to two rows from each of the vertical charge transfer registers and sequentially transfers them to an output section. The signal charges corresponding to the two pixels adjacent to each other in the vertical direction are added. Thus, the number of times of the horizontal transfer required to output the signal charges of all the pixels is half that of the case where the signal charges are individually outputted. Hence, a time required to output the signal charges of all the pixels is also half.

FIG. 1 is a sectional side view showing a wiring connection and a structure of a side section along a transfer direction of the horizontal charge transfer register 405 in the solid state imaging apparatus 400. Referring to FIG. 1, signal charges of two pixels adjacent to each other in the horizontal direction are added. At this time, the timings of a pulse φH1L applied to a final electrode of the horizontal charge transfer register 405 and a reset pulse φR applied to a reset gate electrode are set to have the periods equal to two times of those of the drive pulses φH1 and φH2 applied to the transfer electrode of the horizontal charge transfer register 405. Such a method is disclosed in, for example, Japanese Laid Open Patent Application (JP-A-Heisei 4-256364).

The horizontal charge transfer register 405 is a CCD (Charge Coupled Device). As shown in FIG. 1, a P-type diffusion layer 702 serving as a charge transfer region of the horizontal charge transfer register 405 is formed on a main surface of an N-type diffusion layer 701. $P^+$-type regions 703 serving as barrier sections of the charge transfer region are formed in the P-type diffusion layer 702 at the same interval along a charge transfer direction. Also, charge transfer electrodes 705 are arrayed through an insulating layer 704 on the surface of the P-type diffusion layer 702.

Each charge transfer electrode 705 is composed of a set of an accumulation section electrode 705A above the P-type diffusion layer 702 and a barrier section electrode 705B above the $P^+$-type region 703. The charge transfer electrodes 705 are alternatively connected to one of two horizontal bus lines 706. Two-phase drive pulses φH1 and φH2 are applied through the horizontal bus lines 706 to the respective transfer electrodes 705. The drive pulses φH1 and φH2 have a phase difference of 180 degrees from each other.

A final electrode 707, an output gate electrode 708 and a reset gate electrode 709 are formed on the insulating layer 704 in this order toward the end of the horizontal charge transfer register 405. A pulse φH1L, a direct current voltage OG and a reset pulse φR are applied to the above electrodes, respectively.

A first $N^+$-type diffusion layer 710 is formed in the P-type diffusion layer 702 between the output gate electrode 708 and the reset gate electrode 709 to serve as an electrode of a floating capacitor for a charge detector 407. A second $N^+$-type diffusion layer 711 is formed on a side opposite to the first $N^+$-type diffusion layer 710 with respect to the reset gate electrode 709 to serve as a reset gain. The first $N^+$-type diffusion layer 710 is connected to an input terminal of the charge detector 407. On the contrary, the second $N^+$-type diffusion layer 711 is fixed to a predetermined direct current potential VRD.

FIGS. 2A to 2D are timing charts showing the pulse signals φH1, φH2, φH1L and φR applied to the transfer electrodes, the final electrode and the reset gate electrode of the horizontal charge transfer register 405. The timing charts show the pulse signals when the signal charges of the respective pixels are individually outputted. the drive pulse signals φH1 and φH2 are two-phase two-value pulse signals which are out of phase by 180 degrees from each other. The pulse signal φH1L has the same phase as the drive pulse signal φH1. In FIGS. 2A to 2D, a level HL indicates a low level of the drive pulse signals φH1 and φH2 and the pulse signal φH1L, and a level HH indicates a high level of the drive pulse signals φH1 and φH2 and the pulse signal φH1L. Also, levels RH and RL indicate the high level and low level of the reset pulse signal φR.

FIGS. 3A to 3D are diagram showing the accumulation states of the signal charges and the potentials along the transfer direction of the horizontal charge transfer register 405 at the respective times t1 to t3 of FIGS. 2A to 2D. FIG. 3A schematically shows the horizontal charge transfer register 405. FIGS. 3A to 3D show the states of the signal charge CS and potential distributions at the respective portions of the horizontal charge transfer register 405, for each of the times t1 to t3.

The signal charges CS are individually transferred through the charge transfer registers 705 to the first $N^+$-type diffusion layer 710 serving as the electrode of floating capacitance. Thus, the voltage conversion is performed to the signal charges SC. Then, the voltage is outputted from the output terminal 408 through the charge detector 407 of the solid state imaging apparatus to an external unit. After that, the signal charges of the first $N^+$-type diffusion layer 710 are sent out to the second N+-type diffusion layer 711 serving as the reset drain, when the pulse signal φR is applied to the reset gate electrode 709.

A case of adding and outputting signal charges of two pixels adjacent to each other in a horizontal direction will be described below. FIGS. 4A to 4D are timing charts showing the pulse signals applied to the transfer electrode, the final electrode and the reset gate electrode of the horizontal charge transfer register 405. FIGS. 5A to 5E are diagrams showing the accumulation states of the signal charges and the potentials along the transfer direction of the horizontal charge transfer register 405 at the respective times t1 to t4 of FIGS. 4A to 4D. Also, FIGS. 5A to 5E correspond to FIGS. 3A to 3D.

As shown in FIGS. 4A to 4D, periods of the drive pulse signals φH1 and φH2 applied to the transfer electrodes of the horizontal charge transfer register 405 are equal to a period when a signal charge of one pixel is individually outputted. However, the period of the pulse signal φH1L applied to the final electrode 707 and the period of the pulse signal φR applied to the reset gate electrode 709 are set to be equal to two times that of the case of individually outputting the signal charges, as seen from FIGS. 2C and 2D. Accordingly, the signal charge CS are transferred through the horizontal charge transfer register 405 to the first N+-type diffusion layer 710, after the signal charges CS corresponding to the two pixels adjacent to each other are added below the final electrode 707.

However, the frame rate is not changed, even if the signal charges of the pixels adjacent to each other in the horizontal direction are added and outputted, differently from the case of adding and outputting the signal charges of the pixels adjacent to each other in the vertical direction. That is, the drive pulse signals φH1 and φH2 applied to the transfer electrodes 705 of the horizontal charge transfer register 405 are the same as those of the case of individually outputting the signal charges CS of the respective pixels. Thus, a rate at which the signal charge is transferred in the horizontal charge transfer register 405 is not changed. As a result, a time required to output all the signal charges of the horizontal charge transfer register 405 is also same. Hence, even if the signal charge corresponding to a total of four pixels of two pixels in the horizontal direction and two pixels in the vertical direction is added and outputted, the frame rate can be increased only to two times, although a data amount is ¼.

In conjunction with the above description, a driving method in a solid state imaging apparatus is disclosed in Japanese Laid Open Patent Application (JP-A-Heisei 4-262679). In this reference, the charge read out in response to a TG pulse is transferred for one stage in response to a line shift pulse A in a first field. The charge transferred into a horizontal CCD register is transferred through the horizontal CCD register. Thereafter, the charge in a vertical CCD register is transferred for two stages in response to a line shift pulse B during one horizontal blanking period. By transfer for the two stage, the charges for two photodiodes adjacent in the vertical CCD register are added to produce an addition charge. The addition charge is transferred in a horizontal direction. In a second field, the vertical transfer is carried out twice in response to the line shift pulse B during one horizontal blanking period and the charges from the two adjacent photodiodes are added in the horizontal CCD register. The added charges are transferred in the horizontal direction.

Also, a solid state imaging apparatus is disclosed in Japanese Laid Open Patent Application (JP-A-Heisei 4-277986). In this reference, a shift register is composed of unit circuits connected in series and the unit circuit is composed of 2-stage clocked inverter. The shift register is divided into three blocks A, B and C to which start pulses $\phi_{STA}$, $\phi_{STB}$ and $\phi_{STC}$ are applied, respectively. Also, clock pulses $\phi_1$, /$\phi_1$, $\phi_2$ and /$\phi_2$ are supplied in common. By controlling the start pulses and the clock pulses supplied to the blocks A, B and C, the outputs of the blocks A, B and C are changed to scan a part or whole of pixels.

Also, an image recording apparatus is disclosed in Japanese Laid Open Patent Application (JP-A-Heisei 5-30437). In this reference, an imaging plane 15 of a solid state imaging apparatus in which photoelectric converting elements are arranged in a matrix is divided into blocks B1, B2, . . . , B16 in a column direction. The column of the photoelectric converting elements is a scanning line. The scanning lines of the blocks are scanned to produce a multi-channel video signals S1, S2, . . . , S16. A first scanning circuit 16 provides line scanning start point H1, H2, . . . , H16 in the blocks B1, B2, . . . , B16 in a scanning line direction, and selects read blocks. A second scanning circuit 17 carries out the selection of the line scanning start point H1, H2, . . . , H16 and the number of line scanning pixels. Imaging areas having different the line scanning start positions are selected in response to drive signals using the first and second scanning circuits to produce a multi-channel video signal.

Also, an imaging sensor is disclosed in Japanese Laid Open Patent Application (JP-A-Heisei 10-136244). In this reference, an interline type CCD image sensor has a color filter suitable for read of all pixels in a sequential line scan. The CCD imaging sensor is driven a high speed mode in a normal mode, and in a high precision mode only when a trigger is pushed. The imaging sensor outputs one line signal for every three lines in a vertical direction in the high speed mode. An image is displayed on a LCD display section at a frame rate of 60 frames/sec. in the high speed mode.

Also, a solid state imaging apparatus is disclosed in Japanese Laid Open Patent Application (JP-A-Heisei 10-107252). In this reference, the imaging apparatus is composed vertical transfer sections 12 for transferring charges generated in a light receiving section in a vertical direction and a horizontal transfer section 4 for transferring the charges supplied from the vertical transfer sections 12 in a horizontal direction. Charge abandon sections are provided to selectively abandon the charges from the vertical transfer sections 12 in response to a control signal φC. The charge abandon section is composed of a control electrode 34 applied with the control signal φC, a potential barrier region in which the magnitude of a barrier potential is changed in accordance with the control signal φC, and an impurity region 26 in which the charge is abandoned through the potential barrier region.

SUMMARY OF THE INVENTION

Therefore, an object of the present invention is to provide a solid state imaging apparatus with a horizontal charge transfer register which can improve a frame rate, even if signal charges of a plurality of pixels adjacent to each other in a horizontal direction are added and outputted.

In order to achieve an aspect of the present invention, a charge transfer structure includes an insulating film on a first semiconductor region, a plurality of transfer electrodes and a signal generating circuit. The plurality of transfer electrodes are formed on the insulating film, and each of the plurality of transfer electrodes is composed of a barrier electrode and an accumulation electrode. The signal generating circuit generates first to 2N-th (N is a positive integer more than 1) pulse signals which are supplied to every 2N transfer electrodes of the plurality of transfer electrodes in an interline mode, such that a signal charge can be transferred for the 2N transfer electrodes at maximum during one cycle of the first to 2N-th pulse signals.

Here, the charge transfer structure may further include a second semiconductor region formed in a surface portion of the first semiconductor region below the barrier electrode of each of the plurality of transfer electrodes, the second semiconductor region having a same conductive type as the first semiconductor region.

Also, every adjacent two of the first to 2N-th pulse signals may have a same phase, and odd order pulse signals of the first to 2N-th pulse signals may have different phases. In this case, a different offset voltage is applied to every adjacent two of the first to 2N-th pulse signals.

Also, when N is 2, the first pulse signal and the second pulse signal have a same phase, the third pulse signal and the fourth pulse signal have a same phase, and the first pulse signal and the third pulse signal are opposite in phase. In this case, offset voltages are applied to the first and third pulse signals. Also, a lower level of the first pulse signal is higher than a higher level of the second pulse signal, and a lower level of the third pulse signal is higher than a higher level of the fourth pulse signal.

In addition, when N is 2, the signal charge is transferred for the three electrodes during a first half of the one cycle and for the five electrodes during a second half of the one cycle, in the interline mode.

The charge transfer structure may further include an output electrode formed on the insulating film to detect an accumulated charge, and an output semiconductor region formed in a surface portion of the first semiconductor region below the output electrode to accumulate as the accumulated charge the signal charges transferred using the plurality of transfer electrodes. Also, the charge transfer structure may further include a reset electrode formed on the insulating film close to the output electrode and operating to abandon the accumulated charge from the output semiconductor region in response to a reset signal generated by the signal generating circuit.

Also, the signal generating circuit generates the first to 2N-th pulse signals in an individual mode such that all of odd order pulse signals of the first to 2N-th pulse signal have a same phase, all of even order pulse signals of the first to 2N-th pulse signals have a same phase, the first pulse signal and the second pulse signal are opposite in phase, all of the first to 2N-th pulse signals have a same higher level and a same lower level.

Also, when N is 2, the signal generating circuit generates the first to fourth pulse signals in an individual mode such that the first and third pulse signals have a same phase, the second pulse signal and the fourth pulse signal have a same phase, the first pulse signal and the second pulse signal are opposite in phase, all of the first to fourth pulse signals have a same higher level and a same lower level.

In order to achieve another aspect of the present invention, a solid state imaging apparatus includes vertical charge transfer registers, an insulating film, a plurality of transfer electrodes and a signal generating circuit. The vertical charge transfer registers transfers signal charges in a vertical direction. The insulating film is formed on a first semiconductor region. The plurality of transfer electrodes are formed on the insulating film. Each of the plurality of transfer electrodes is composed of a barrier electrode and an accumulation electrode, and the accumulation electrodes receive the signal charges from the vertical charge transfer registers. The signal generating circuit generates first to 2N-th (N is a positive integer more than 1) pulse signals which are supplied to every 2N transfer electrodes of the plurality of transfer electrodes in an interline mode, such that the signal charge can be transferred in a horizontal direction for the 2N transfer electrodes at maximum during one cycle of the first to 2N-th pulse signals.

BRIEF DESCRIPTION OF THE DRAWINGS

FIGS. 2A to 2D are timing charts showing pulse signals applied to transfer electrodes, a final electrode and a reset gate electrode of the horizontal charge transfer register, when signal charges of respective pixels are individually outputted in the conventional solid state imaging apparatus;

FIGS. 3A to 3D are a side section structure along a transfer direction of a horizontal charge transfer register in the conventional solid state imaging apparatus and diagrams showing accumulation states of signal charges along the transfer direction of the horizontal charge transfer register at respective times t1 to t3 of FIGS. 2A to 2D;

FIGS. 4A to 4D are timing charts showing pulse signals applied to the transfer electrodes, the final electrode and the reset gate electrode of the horizontal charge transfer register, when signal charges of two pixels adjacent to each other in a horizontal direction are added and outputted in the conventional solid state imaging apparatus;

FIGS. 5A to 5E are a side section structure along a transfer direction of a horizontal charge transfer register in the conventional solid state imaging apparatus and diagrams showing accumulation states of signal charges along the transfer direction of the horizontal charge transfer register at respective times t1 to t4 of FIGS. 4A to 4D;

FIG. 6 is a plan view showing a configuration of an interline transfer type solid state imaging apparatus according to an embodiment of the present invention;

FIGS. 7A to 7E are timing charts showing pulse signals applied to each transfer electrode of a vertical charge transfer register within a horizontal blanking period in the solid state imaging apparatus according to the embodiment of the present invention;

FIGS. 8A to 8H are diagrams showing accumulation states of signal charges along a transfer direction of the vertical charge transfer register at respective times T1 to T7 of FIGS. 7A to 7E;

FIGS. 10A to 10F are timing charts showing drive pulse signals applied to transfer electrodes, a final electrode and a reset gate electrode of the horizontal charge transfer register in the solid state imaging apparatus according to the embodiment of the present invention; and FIGS. 11A to 11D are the sectional side view showing the horizontal charge transfer register and diagrams showing accumulation states of signal charges along a transfer direction of the horizontal charge transfer register at respective times t1 to t3 of FIGS. 10A to 10F in the solid state imaging apparatus according to the embodiment of the present invention.

DESCRIPTION OF THE PREFERRED EMBODIMENTS

Figure 1:
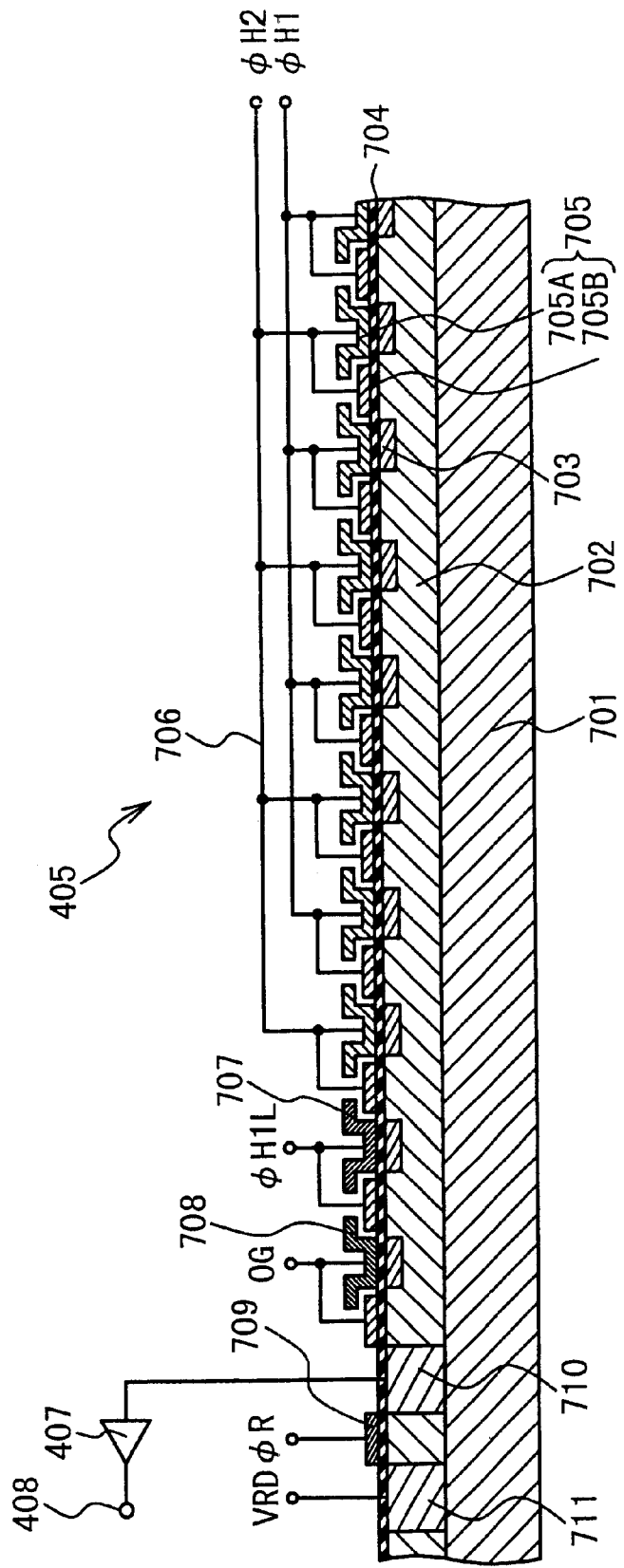
FIG. 1 is a sectional side view showing a wiring connection and a side section structure along a transfer direction of a horizontal charge transfer register in a conventional solid state imaging apparatus.

Hereinafter, an interline transfer type solid state imaging apparatus of the present invention will be described below in detail with reference to the attached drawings.

FIG. 6 is a plan view showing a configuration of the interline transfer type solid state imaging apparatus according to the embodiment of the present invention. Referring to FIG. 6, the interline transfer type solid state imaging apparatus 400 is composed of vertical charge transfer registers 402 as a plurality of charge transfer elements arrayed on a semiconductor substrate 401 and a large number of photoelectric converting elements 403 arrayed in correspondence to the respective vertical charge transfer registers 402.

The plurality of vertical charge transfer registers 402 are formed on the semiconductor substrate at a certain interval in a vertical direction in substantially parallel to each other. The photoelectric converting elements 403 are arrayed along the vertical charge transfer registers 402 and generate signal charges on light reception. Each photoelectric converting element 403 outputs the signal charge to a corresponding one of the vertical charge transfer registers 402. A pixel 404 is composed of a single charge holding unit of the vertical charge transfer register 402 and the photoelectric converting element 403 arranged for the charge holding unit.

A horizontal charge transfer register 405A is formed on an end side of the vertical charge transfer registers 402 to receive a signal charge from each vertical charge transfer register 402 and to transfer in a predetermined direction. The horizontal charge transfer register 405 is composed of a plurality of transfer electrodes which are arrayed in a line to be connected to the vertical charge transfer registers 402, respectively.

A charge detector 407 is formed at an end of the horizontal charge transfer register 405A to be electrically coupled to the horizontal charge transfer register 405A. A signal from the charge detector 407 is outputted from an output terminal 408 to an external unit.

In such a solid state imaging apparatus 400, there are an individual mode in which a signal charge of each of pixels is individually outputted and an interline mode in which signal charges for a plurality of pixels adjacent to each other are collectively outputted. When the signal charges of the plurality of pixels are added and outputted, a resolution is degraded. However, it is possible to shorten a time required to output all the signal charges to thereby increase a frame rate.

An operation will be described below of adding and outputting the signal charges for a total of four pixels composed of two pixels in a horizontal direction and two pixels in a vertical direction, in the solid state imaging apparatus according to the embodiment of the present invention.

FIGS. 7A to 7E are timing charts showing pulse signals applied to each transfer electrode of the vertical charge transfer register 402 within a horizontal blanking period. Also, FIGS. 8A to 8H are a cross sectional view of the vertical charge transfer register 402 and diagram showing the accumulation states of the signal charges along a transfer direction of the vertical charge transfer register 402 at respective times T1 to T7 shown in FIGS. 7A to 7E.

The signal charge is read out to the vertical charge transfer register 402 from the photoelectric converting element 403 and is transferred toward the horizontal charge transfer register 405A through the vertical charge transfer register 402. At this time, the pulse signals $\phi V1$, $\phi V2$, $\phi V3$ and $\phi V4$ are applied to the transfer electrode of the vertical charge transfer register 402 twice within the horizontal blanking period. Thus, the signal charge is transferred for two pixels. In this case, a signal charge at a final stage of each vertical charge transfer register 402 and a signal charge at a previous stage to the final stage are continuously transferred to the horizontal charge transfer register 405A, and added in the horizontal charge transfer register 405A.

In FIGS. 7A to 7E, a signal $\phi H1$ is a drive pulse signal applied to the transfer electrode of the horizontal charge transfer register 405. Signals $\phi V1$ to $\phi V4$ are drive pulse signals applied to the transfer electrodes of the vertical charge transfer register 402. Also, the drive pulse signals $\phi V1$ to $\phi V4$ are four-phase pulse signals having an active low level. Each time the drive pulse signals $\phi V1$ to $\phi V4$ are sequentially set to the low level in this order, the charge is transferred in the vertical charge transfer register 402 toward the horizontal charge transfer register 405A for one pixel.

Referring to FIG. 8A, the vertical charge transfer register 402 is shown. FIGS. 8B to 8H show the accumulation states of the signal charges at the respective times T1 to T5 shown in FIGS. 5B to 5E. In the period between the times T1 and T3, a first signal charge SC is transferred in a left direction for one pixel, and arrives at a portion of the horizontal charge transfer register 405A. In the period between the times T4 and T7, a second signal charge SC is again transferred in the left direction for one pixel, and arrives at the horizontal charge transfer register 405A. Thus, the second signal charge is added to the first signal charge. In the period between time T1 to time T7, each of the drive pulse signals $\phi V1$ to $\phi V4$ is set to the low level two times, as shown in FIGS. 7A to 7E.

The horizontal charge transfer register 405A receives the signal charges corresponding to two lines from the vertical charge transfer registers 402 and sequentially transfers to the output section 407. The signal charges for the two pixels adjacent to each other in the vertical direction are added in the horizontal charge transfer register 405A. Thus, the number of times of the vertical transfer required to output the signal charges of all the pixels is half that of the case of individually outputting the signal charges. Hence, a time required to output the signal charges of all the pixels becomes also half.

Figure 9:
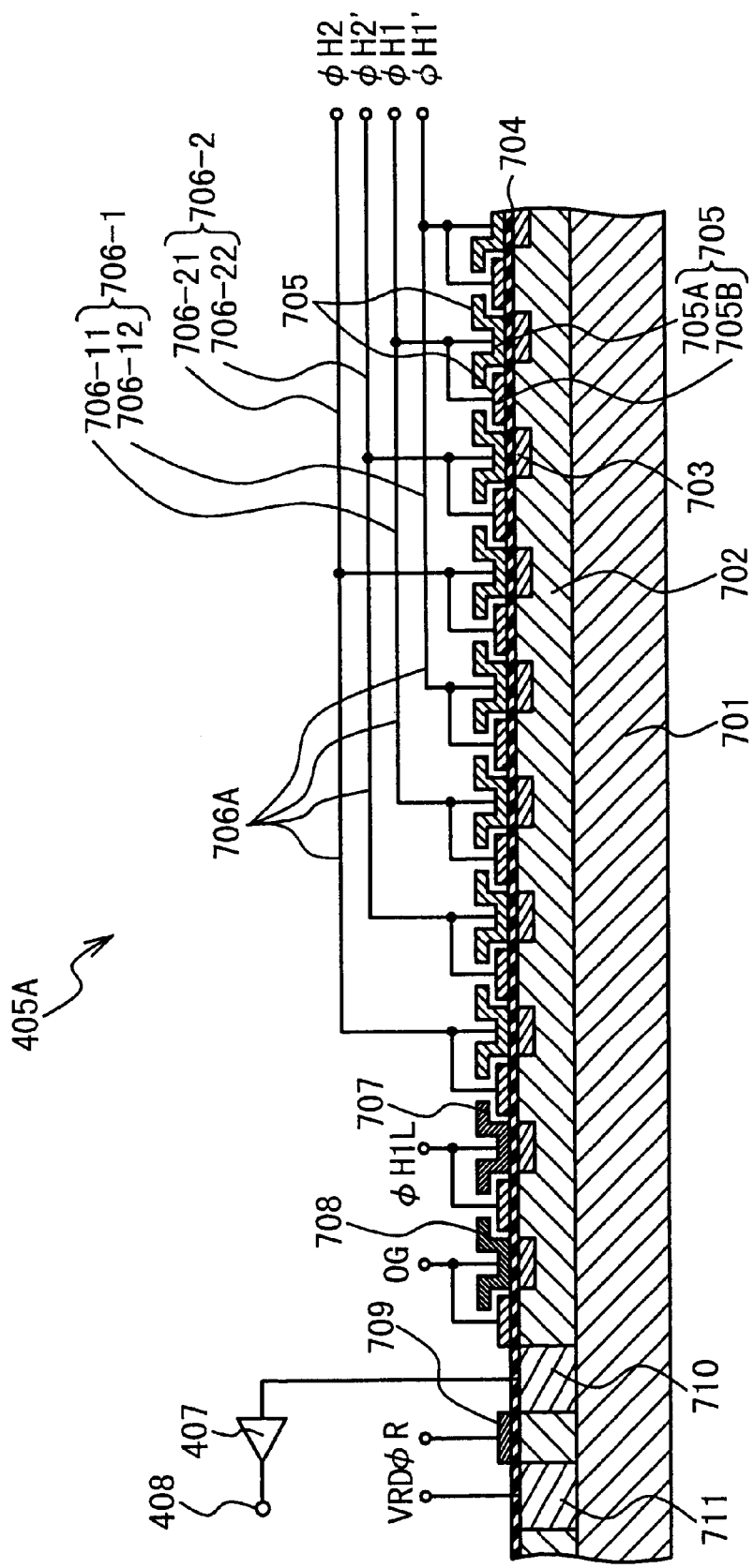
FIG. 9 is a sectional side view showing a wiring connection and a section structure of a horizontal charge transfer register of the solid state imaging apparatus according to the embodiment of the present invention.

FIG. 9 is a sectional side view showing the wiring connection and the sectional structure of the horizontal charge transfer register of the solid state imaging apparatus according to the embodiment of the present invention. FIGS. 10A to 10F are timing charts showing drive pulse signals $\phi H1$, $\phi H1'$, $\phi H2$, $\phi H2'$, $\phi H1L$ and $\phi R$ applied to the respective transfer electrodes of the horizontal charge transfer register 405A, respectively. FIGS. 11A and 11D are a cross sectional view of the solid state imaging apparatus in this embodiment and diagrams showing the accumulation states of signal charges along the transfer direction of the horizontal charge transfer register 405A at respective times t1 to t3 in FIGS. 2A to 2F.

The solid state imaging apparatus in this embodiment will be described below with reference to FIG. 9, FIGS. 10A to 10F and FIGS. 11A to 11D.

The horizontal charge transfer register 405A is a CCD (Charge Coupled Device). As shown in FIG. 9, a P-type diffusion layer 702 serving as a charge transfer region of the horizontal charge transfer register 405A is formed on a main surface of an N-type diffusion layer 701. $P^+$-type regions 703 serving as barrier sections in the charge transfer region are formed in the P-type diffusion layer 702 at the same interval along a charge transfer direction. Also, charge transfer electrodes 705 are arrayed through an insulating layer 704 on the surface of the P-type diffusion layer 702.

Each charge transfer electrode 705 is composed of a set of an accumulation section electrode 705A above the P-type diffusion layer 702 and a barrier section electrode 705B above the $P^+$-type region 703. The charge transfer electrodes 705 are connected to four horizontal bus lines 706A (706-12, 706-11, 706-22 and 706-21). Four different drive pulses φH1', φH1, φH2' and φH2 are applied through the horizontal bus lines 706A to the respective transfer electrodes 705. The drive pulses φH1 and φH1' have the same phase but different levels. The drive pulses φH2 and φH2' have the same phase but different levels. The drive pulse signals φH1 and φH2 have a phase difference of 180 degrees from each other.

A final electrode 707, an output gate electrode 708 and a reset gate electrode 709 are formed on the insulating layer 704 in this order toward the end of the horizontal charge transfer register 405A. A pulse signal φH1L, a direct current voltage OG and a reset pulse signal φR are applied to the above electrodes, respectively.

A first $N^+$-type diffusion layer 710 is formed in the P-type diffusion layer 702 between the output gate electrode 708 and the reset gate electrode 709 to serve as an electrode of a floating capacitor for a charge detector. A second $N^+$-type diffusion layer 711 is formed on a side opposite to the first $N^+$-type diffusion layer 710 with respect to the reset gate electrode 709 to serve as a reset gain. The first $N^+$-type diffusion layer 710 is connected to an input terminal of the charge detector 407. On the contrary, the second $N^+$-type diffusion layer 711 is fixed to a predetermined direct current potential VRD.

As seen from the above, the wiring connection is different between the horizontal charge transfer register 405A of the solid state imaging apparatus in this embodiment and the conventional horizontal charge transfer register 405. That is, in the conventional horizontal charge transfer register 405, the two horizontal bus lines 706 are formed such that different pulse signals can be applied to transfer electrodes. On the contrary, in the horizontal charge transfer register 405A of the solid state imaging apparatus of the present invention, four horizontal bus lines 706A are formed as shown in FIG. 9 so that four different pulse signals can be applied to the four transfer electrodes for a period.

That is, in the horizontal charge transfer register 405 in this embodiment, the number of phases of the drive pulse signals required in the individual mode is 2. Thus, the two drive pulse signals φH1 and φH2 whose phases are opposite to each other are applied through the two bus lines 706 to the transfer electrodes 705. However, in the interline mode, the bus lines 706A equal to two time the above-mentioned number of phases, namely, four bus lines 706A are formed to send the drive pulse signal to each transfer electrode 705 of the horizontal charge transfer register 405A. An interval between the transfer electrodes 705 connected to the same lines 706A is constant.

In further detail, the lines 706A are divided into first and second line pairs 706-1, 706-2. First and second lines 706-11 and 706-12 of the first wiring pair 706-1 are connected to the transfer electrodes 705 immediately adjacent to each other. First and second lines 706-21 and 706-22 of the second line pair 706-2 are also connected to transfer electrodes 705 immediately adjacent to each other which are different from and adjacent to he above transfer electrodes.

In such configuration, as shown in FIG. 9, the drive pulse signals φH1 and φH1' whose phases are identical to each other are applied to the first and second lines 706-11 and 706-12 of the first line pair 706-1. On the other hand, as shown in FIG. 9, the drive pulse signals φH2 and φH2' whose phases are opposite to those of the drive pulse signals φH1 and φH1' and identical to each other are applied to the first and second lines 706-21 and 706-22 of the second line pair 706-2.

As seen from FIGS. 10B and 10D, offset voltages are applied to the drive pulse signals φH1' and φH2' so that a potential HL' at a low level of the drive pulse signals φH1' and φH2' is higher than a potential HH at a high level of the drive pulse signals φH1 and φH2. In FIGS. 10B and 10D, the potential HL indicates the potential at the low level of the drive pulse signals φH1 and φH2, and the potential HH' indicates the potential at the high level of the drive pulse signals φH1 ' and φH2'. The potential HL at the low level of the drive pulse signals φH1 and φH2 are connected to the ground potential in this embodiment.

When the horizontal charge transfer register 405A is driven by such drive pulse signals φH1 , φH1', φH2 and φH2', a period of a change of the potential in the horizontal charge transfer register 405A corresponds to the four transfer electrodes, as shown in FIGS. 11A to 11D. Each time the drive pulse signals is sent once through the lines 706A, the signal charge is transferred for the two transfer electrodes. Also, the signal charges corresponding to two pixels immediately adjacent to each other in a horizontal direction are added during the transfer for the two transfer electrodes at the first cycle of the drive pulse signals and then outputted to the final electrode 707. Thus, a time required to transfer all the charges supplied from the vertical charge transfer register to the diffusion layer 710 of the horizontal charge transfer register 405A can be reduced to half to thereby double a frame rate of the solid state imaging apparatus.

As a result, if the signal charges corresponding to the two pixels adjacent to each other are added in the vertical charge transfer register, the signal charges corresponding to four pixels can be outputted from the horizontal charge transfer register 405A at a time to thereby make the frame rate equal to four times.

This embodiment is designed so as to form the four horizontal bus lines 706A. However, if the number of horizontal bus lines is further increased, the signal charges having a larger number of pixels adjacent to each other in the horizontal direction can be added. Also, a transfer pitch of the added signal charge can be made larger to thereby make the frame rate further higher.

Generally, if 2n (n is a positive integer larger than 1) horizontal bus lines 706A are formed, a time required to output all the signal charges in the horizontal charge transfer register 405A can be reduced to 1/n. In this case, if the drive pulse signal is applied to the transfer electrode of the vertical charge transfer register m times (m is a positive integer more than 1) for a horizontal blanking period, the number of times of the horizontal transfer required to output the signal charges of all the pixels can be reduced to 1/m to thereby make the frame rate equal to n×m times. In this case, (n−1) kinds of offset voltage are used to have gradually higher voltages. Thus, n signal charges are added and outputted in the single period. The added signal charges are transferred for the n transfer electrodes in the single period.

If the drive pulse signals φH1 and φH2 are assumed to be the same drive pulse signal and also the drive pulse signals φH1' and φH2' are assumed to be the same drive pulse signal, the drive pulse signals are applied to the transfer electrodes 705, as in the conventional example. In this case, the signal charges of the respective pixels adjacent to each other in the horizontal direction are transferred for one transfer electrode in response to once application of the drive pulse signals, and then outputted without the addition. Thus, the solid state imaging apparatus can operate in the same manner as the conventional example. Hence, in this embodiment, the solid state imaging apparatus can operate at a higher frame rate in the interline mode and a high accuracy in the individual mode.

What is claimed is:

1. A charge transfer structure comprising:

an insulating film on a first semiconductor region;

a plurality of transfer electrodes formed on said insulating film, wherein each of said plurality of transfer electrodes is composed of a barrier electrode and an accumulation electrode; and a signal generating circuit generating first to 2N-th (N is a positive integer more than 1) pulse signals which are supplied to every 2N transfer electrodes of said plurality of transfer electrodes in an interline mode, such that a signal charge is transferred for all of the 2N transfer electrodes during one cycle of said first to 2N-th pulse signals, wherein every immediately adjacent pair of said first to 2N-th pulse signals have a same phase, and odd order pulse signals of said first to 2N-th pulse signals have different phases.

2. A charge transfer structure according to claim 1, further comprising a second semiconductor region formed in a surface portion of said first semiconductor region below said barrier electrode of each of said plurality of transfer electrodes, said second semiconductor region having a same conductive type as said first semiconductor region.

3. A charge transfer structure according to claim 1, wherein a different offset voltage is applied to every immediately adjacent pair of said first to 2N-th pulse signals.

4. A charge transfer structure comprising:

an insulating film on a first semiconductor region;

a plurality of transfer electrodes formed on said insulating film, wherein each of said plurality of transfer electrodes is composed of a barrier electrode and an accumulation electrode; and a signal generating circuit generating first to 2N-th (N is a positive integer more than 1) pulse signals which are supplied to every 2N transfer electrodes of said plurality of transfer electrodes in an interline mode, such that a signal charge is transferred for all of the 2N transfer electrodes during one cycle of said first to 2N-th pulse signals, wherein said first pulse signal and said second pulse signal have a same phase, said third pulse signal and said fourth pulse signal have a same phase, and said first pulse signal and said third pulse signal are opposite in phase, wherein offset voltages are applied to said first and third pulse signals, wherein a lower level of said first pulse signal is higher than a higher level of said second pulse signal, and a lower level of said third pulse signal is higher than a higher level of said fourth pulse signal.

5. A charge transfer structure according to claim 1, wherein N is 2, and wherein in said interline mode, said signal charge is transferred for two electrodes during a first half of said one cycle and for another two electrodes during a second half of said one cycle.

6. A charge transfer structure according to claim 1, further comprising:

an output electrode formed on said insulating film to detect an accumulated charge; and an output semiconductor region formed in a surface portion of said first semiconductor region below said output electrode to accumulate as said accumulated charge said signal charges transferred using said plurality of transfer electrodes.

7. A charge transfer structure according to claim 6, further comprising:

a reset electrode formed on said insulating film close to said output electrode and operating to discharge said accumulated charge from said output semiconductor region in response to a reset signal, wherein said signal generating circuit further generates said reset signal.

8. A charge transfer structure according to claim 1, wherein said signal generating circuit generates said first to 2N-th pulse signals in an individual mode such that all of odd order pulse signals of said first to 2N-th pulse signal have a same phase, all of even order pulse signals of said first to 2N-th pulse signals have a same phase, said first pulse signal and said second pulse signal are opposite in phase, all of said first to 2N-th pulse signals have a same higher level and a same lower level.

9. A charge transfer structure according to claim 1, wherein N is 2, and wherein said signal generating circuit generates first to fourth pulse signals in an individual mode such that said first and third pulse signals have a same phase, said second pulse signal and said fourth pulse signal have a same phase, said first pulse signal and said second pulse signal are opposite in phase, all of said first to fourth pulse signals have a same higher level and a same lower level.

10. A solid state imaging apparatus comprising:

vertical charge transfer registers transferring signal charges in a vertical direction;

an insulating film on a first semiconductor region;

a plurality of transfer electrodes formed on said insulating film, wherein each of said plurality of transfer electrodes is composed of a barrier electrode and an accumulation electrode, and said accumulation electrodes receive said signal charges from said vertical charge transfer registers; and a signal generating circuit generating first to 2N-th (N is a positive integer more than 1) pulse signals which are supplied to every 2N transfer electrodes of said plurality of transfer electrodes in an interline mode, such that said signal charge is transferred in a horizontal direction for all of the 2N transfer electrodes during one cycle of said first to 2N-th pulse signals, wherein said first pulse signal and said second pulse signal have the same phase, said third pulse signal and said fourth pulse signal have a same phase, and said first pulse signal and said third pulse signal are opposite in phase, wherein a lower level of said first pulse signal is higher than a higher level of said second pulse signal, and a lower level of said third pulse signal is higher than a higher level of said fourth pulse signal.

11. A solid state imaging apparatus according to claim 10, further comprising a second semiconductor region formed in a surface portion of said first semiconductor region below said barrier electrode of each of said plurality of transfer electrodes, said second semiconductor region having a same conductive type as said first semiconductor region.

12. A solid state imaging apparatus comprising:

vertical charge transfer registers transferring signal charges in a vertical direction;

an insulating film on a first semiconductor region;

a plurality of transfer electrodes formed on said insulating film, wherein each of said plurality of transfer electrodes is composed of a barrier electrode and an accumulation electrode, and said accumulation electrodes receive said signal charges from said vertical charge transfer registers; and a signal generating circuit generating first to 2N-th (N is a positive integer more than 1) pulse signals which are supplied to every 2N transfer electrodes of said plurality of transfer electrodes in an interline mode, such that said signal charge is transferred in a horizontal direction for all of the 2N transfer electrodes during one cycle of said first to 2N-th pulse signals, wherein every immediately adjacent pair of said first to 2N-th pulse signals have a same phase, and odd order pulse signals of said first to 2N-th pulse signals have different phases.

13. A solid state imaging apparatus according to claim 12, wherein a different offset voltage is applied to every immediately adjacent pair of said first to 2N-th pulse signals.

14. A solid state imaging apparatus according to claim 10, wherein offset voltages are applied to said first and third pulse signals.

15. A solid state imaging apparatus according to claim 10, further comprising:

an output electrode formed on said insulating film to detect an accumulated charge; and an output semiconductor region formed in a surface portion of said first semiconductor region below said output electrode to accumulate as said accumulated charge said signal charges transferred using said plurality of transfer electrodes.

16. A solid state imaging apparatus according to claim 15, further comprising:

a reset electrode formed on said insulating film close to said output electrode and operating to abandon said accumulated charge from said output semiconductor region in response to a reset signal, wherein said signal generating circuit further generates said reset signal.

17. A charge transfer structure comprising:

an insulating film on a first semiconductor region;

a plurality of transfer electrodes formed on said insulating film, wherein each of said plurality of transfer electrodes is composed of a barrier electrode and an accumulation electrode;

a second semiconductor region formed in a surface portion of said first semiconductor region below said barrier electrode or each of said plurality of transfer electrodes, said second semiconductor region having a same conductive type as said first semiconductor region; and a signal generating circuit generating first to 2N-th (N is a positive integer more than 1) pulse signals which are supplied to every 2N transfer electrodes of said plurality of transfer electrodes in an interline mode, such that signal charges supplied to said plurality of transfer electrodes are transferred while said signal charges for said 2N transfer electrodes are added at a first cycle of said first 2N-th pulse signals, wherein every immediately adjacent pair of said first to 2N-th pulse signals have a same phase, and odd order pulse signals of said first to 2N-th pulse signals have different phases.

* * * * *